Aug. 15, 1961 R. P. HOLLIS 2,996,675
AMPLITUDE COMPARISON CIRCUIT
Filed Aug. 12, 1958

Inventor
RICHARD P. HOLLIS
By Percy P. Lantzy
Attorney 2,996,675

AMPLITUDE COMPARISON CIRCUIT

Richard P. Hollis, Nutley, N.J., assignor to International Telephone and Telegraph Corporation, Nutley, N.J., a corporation of Maryland Filed Aug. 12, 1958, Ser. No. 754,688

1 Claim. (Cl. 328—115)

This invention relates to an electronic circuit of the amplitude comparison type which also includes the function of a linear amplifier.

It is desirable in reception of radar pulses which may be individual pulses or a train of pulses to utilize these pulses in the generation of very large amplitude pulses to be used as control voltages in other portions of the circuit such as logic circuitry in automatic gain reduction of an amplifier. It is desirable to have a circuit which will combine the functions of a linear amplifier and an amplitude comparator, yielding a large output pulse when the input waveform exceeds a predetermined amplitude. It is also desirable that the trigger level of the circuit be insensitive to the rise time of the input waveform. Multivibrators do not meet these requirements due to the inherent two-state operation of the configuration, with each tube off or on. Blocking oscillators fail to operate as linear amplifiers before firing and do not maintain a sharply defined firing point. The standard amplitude comparator configurations such as disclosed in the Radiation Laboratory Series in the volume "Waveforms" do not yield a sharply defined firing voltage and/or complete preservation of pulse shape at the output up to the point where regeneration occurs.

It is therefore, an object of this invention to provide an electronic circuit which will function both as a linear amplifier and an amplitude comparator.

It is a further object of this invention to provide a circuit wherein the trigger level of the circuit will be insensitive to the rise time of the input waveform.

Another object of this invention is to provide a circuit which can be used in cascade arrangement for multi-amplitude comparison levels to be derived with a minimal amount of circuitry.

A feature of this invention is an electronic circuit responsive to a predetermined minimum amplitude of an input pulse of a group of input pulses to produce a given output pulse of large amplitude and thereafter to produce a given output pulse of large amplitude from the other pulses of the group of slightly less than the predetermined amplitude. A source of input signals is coupled to the input of amplifying means, and a positive feedback loop including a semiconductor diode couples the output of the amplifying means to the input thereof so that a first output pulse of relatively small amplitude from the amplifying means, which is derived from an input pulse having the predetermined amplitude, will have sufficient amplitude to cause the diode to conduct thereby inducing the amplifying means to regenerate and to produce as the output thereof a given output pulse of large amplitude. The passage of the given output pulse of large amplitude through the diode causes heating of the diode and thereby changes the dynamic resistance of the diode so that it will conduct successive output pulses from the amplifying means having less than the sufficient amplitude derived from the other input pulses of the group of less than the predetermined amplitude whereupon the amplifying means will then regenerate and produce successive given output pulses of large amplitude.

The above-mentioned and other features and objects of this invention will become more apparent by reference to the following description taken in conjunction with the accompanying drawings, in which.

The characteristics of a semiconductor diode such as the 1N38 used in the circuit of this invention are such that it will conduct at a given value of voltage and current. When it conducts, and a relatively large amount of current passes through the diode, which has a finite resistance, a heating effect occurs due to the $I^2R$ which tends to increase the sensitivity of the diode a small amount so that it will conduct a subsequent pulse of slightly less voltage amplitude. This property of the semiconductor diode is utilized in the circuit of this invention to capture pulses of a group of pulses which may be diminished in amplitude because of noise and thereby would fail to pass through the crystal diode in the feedback loop. If one pulse of the pulse group has the required predetermined minimum amplitude it will cause conduction through the feedback loop and subsequent regeneration of the circuit so that a large amplitude pulse having a relatively large current will result. When this large amplitude pulse passes through the crystal diode, the consequent heating thereof will now permit following pulses of the pulse group which may have an amplitude slightly less than the predetermined minimum amplitude to pass through the diode and also cause regeneration.

Figure 1:
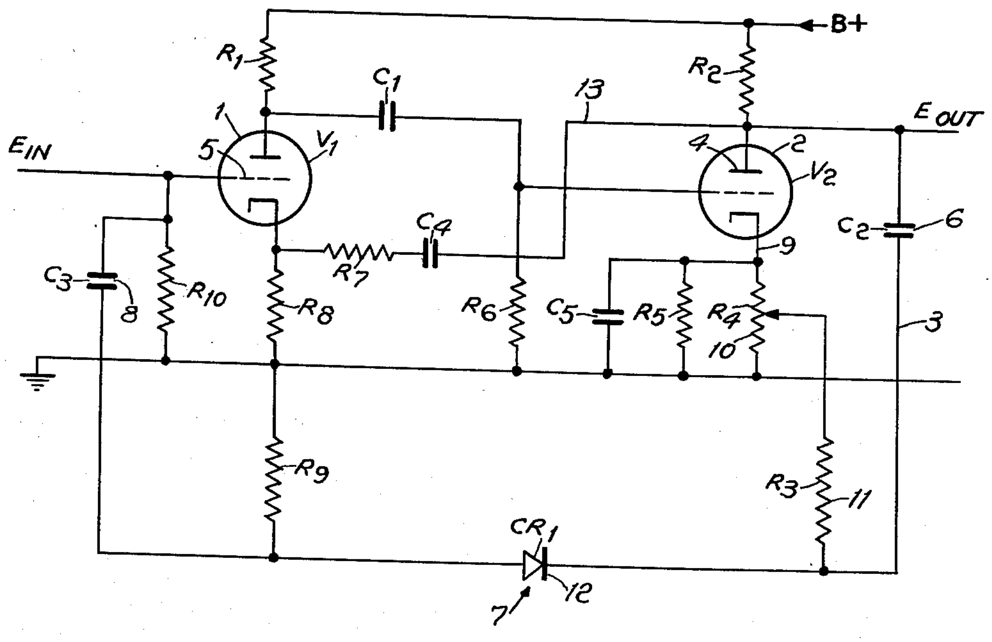
FIG. 1 is a circuit diagram of this invention.

With reference to FIG. 1 there is shown a first electron discharge device 1, the plate output of which is coupled to a second electron discharge device 2 and a positive feedback loop 3 coupling the plate 4 of the discharge device 2 to the input grid 5 of the discharge device 1. The feedback loop 3 comprises a first capacitor 6 in series with a semiconductor diode 7 and a second capacitor 8. Cathode 9 of the discharge device 2 is coupled to ground via a potentiometer 10, the arm of which is coupled via a resistor 11 to the cathode 12 of the semiconductor diode 7 in order to provide a predetermined bias thereon. A negative feedback loop 13 is used to stabilize the current and increase the bandwidth. The bias on the cathode 12 of the diode 7 determines the operating point of the diode. It is obvious that there is no inversion of polarity from the input to the output of the circuit thereby allowing several of these stages to be cascaded if it is desired to use multi-amplitude comparison levels with a minimum amount of circuitry.

Figure 2:
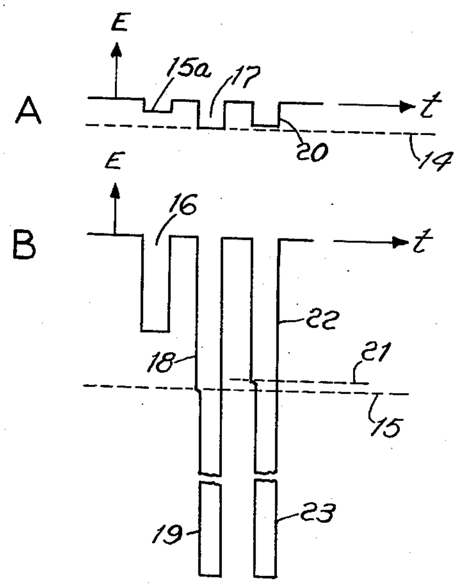
FIG. 2 is a graph of the waveforms shown at different points in the circuit of FIG. 1.

Waveform A of FIG. 2 shows a train of input pulses of negative polarity. The broken line 14 is the firing level of the circuit referred back to the input pulse. Waveform B shows the amplified pulses and regenerated pulses. The broken line 15 is the firing level or the regenerative level of the circuit. Pulse 15*a* is an input pulse which, when amplified to pulse 16 has insufficient amplitude to fire the circuit. Pulse 17 has the minimum required amplitude which when amplified into pulse 18 will fire the circuit and cause it to regenerate thus producing the output pulse 19 of relatively large amplitude and large current. Input pulse 20 has a slightly lower amplitude than pulse 17 but because of the heating of the diode due to the passage therethrough of pulse 19 the firing level has moved slightly to the level of the broken line 21 so that pulse 20, when amplified to pulse 22 will fire and cause the circuit to produce pulse 23. When pulses 19 and 23 charge the capacitor 8, the tube 1 is biased beyond cutoff and become nonconducting thereby preventing further regeneration of these pulses. The charge on the capacitor 8 leaks off and the tube 1 becomes conducting in time for a succeeding pulse to come through. Now, when a succeeding pulse of the group of pulses which has an amplitude less than the predetermined minimum amplitude, such as the pulse 20, passes into the tube 1, the output pulse appearing at the plate 4 will have an amplitude less than that of pulse 18. However, due to the $I^2R$ heating of the diode 7 as explained above, the diode has become more sensitive and the operating point has shifted slightly so that this pulse having less than the voltage amplitude of the pulse 18 will be able to pass through the diode and also cause regeneration of the circuit so that the pulse of relatively large amplitude will result. Successive pulses of relatively large amplitude which are very close together in time such as occurs in the group of pulses, will cause more $I^2R$ heating of the diode so that it will successively become slightly more sensitive until a stable point of thermal equilibrium is reached where the sensitivity will no longer vary. Those pulses which are of insufficient amplitude to overcome the bias on the diode and cause conduction therethrough can be used in succeeding stages of similar circuitry.

It is apparent that for all pulses below a certain amplitude the circuit acts as a linear amplifier. Above this certain amplitude or at a critical amplitude which is sufficient to overcome the bias on the diode, the circuit acts as an amplitude comparator wherein the diode conducts, regeneration occurs and a large output pulse is yielded. This circuit can be used in a cascade arrangement. For instance, it can be arranged so that a two volt input will cause the first stage to fire, a .2 volt input will cause the next stage to fire, a 20 mv. input will cause the third stage to fire and a 2 mv. input will cause the fourth stage to fire, assuming for each stage a gain of 10. It is apparent that in such a cascade arrangement that by determining which stage fires, the amplitude of the input pulses can be ascertained.

In a reduction to practice of this circuit, the following parameters were used:

| | |
|---|---|
| $C_1$ | .01 mf. capacitor. |
| $C_2$ | 200 mmf. capacitor. |
| $C_3$ | 100 mmf. capacitor. |
| $C_4$ | .01 mf. capacitor. |
| $C_5$ | 1 mf. capacitor. |
| $CR_1$ | 1N38 crystal diode. |
| $V_1$, $V_2$ tube type 2C51. | |
| $R_1$, $R_3$, $R_9$ | 10,000 ohms resistor. |
| $R_2$ | 3,300 ohms resistor. |
| $R_4$ | 1,000 ohms variable resistor. |
| $R_5$, $R_8$ | 470 ohms resistor. |
| $R_6$ | 100,000 ohms resistor. |
| $R_7$ | 4,700 ohms resistor. |
| $R_{10}$ | 680 ohms resistor. |
| B+ | 200 volts. |

The gain before firing was 20 db. The minimum input amplitude required for regeneration was 50 mv. and the output pulse amplitude was 40 volts. The circuit maintained a sharply defined firing point from a maximum repetition rate of 80 kc./sec. to 50 pulses per second or lower. With a change in temperature from room temperature to +55° C., the triggering amplitude required changed less than 3 db.

While I have described above the principles of my invention in connection with specific apparatus, it is to be clearly understood that this description is made only by way of example and not as a limitation to the scope of my invention as set forth in the objects and in the accompanying claim.

I claim:

An electronic circuit responsive to a predetermined amplitude of a pulse of a group of input pulses to produce a given output pulse and thereafter to produce said given output pulses from the other pulses of said group of less than said predetermined amplitude, comprising a source of said input signals, first amplifying means comprising a first electron discharge device having at least a control grid, an anode and a cathode, means coupling said source of input signals to said control grid, second amplifying means comprising a second electron discharge device having at least a control grid, an anode and a cathode, means coupling said anode of said first electron discharge device to the control grid of said second discharge device, a negative feedback loop including a resistor in series with a first capacitor coupling said anode of said second discharge device to the said cathode of said first discharge device, a positive feedback loop including a diode in series with a second capacitor coupling said anode of said second discharge device to said control grid of said first discharge device, means to bias said diode at a given level coupling said cathode of said second discharge device to the cathode of said crystal diode whereby a first output pulse from said second discharge device derived from an input pulse having said predetermined amplitude will have sufficient amplitude to overcome said bias and cause said diode to conduct thereby inducing said first and second discharge devices to regenerate and produce as the output of said second discharge device said given output pulse, the passage of said given output pulse of large amplitude through said diode causing heating of said diode and thereby changing the dynamic resistance of said diode so that said diode will conduct successive output pulses from said second discharge device having less than said sufficient amplitude derived from said other pulses of said group of less than said predetermined amplitude and said first and second discharge devices will thereupon regenerate and produce successive given output pulses.

References Cited in the file of this patent

UNITED STATES PATENTS

| | | |
|---|---|---|
| 2,596,510 | Roberts | May 13, 1952 |
| 2,683,806 | Moody | July 13, 1954 |
| 2,860,258 | Hall | Nov. 11, 1958 |

FOREIGN PATENTS

| | | |
|---|---|---|
| 110,883 | Australia | July 4, 1940 |
| 414,187 | Great Britain | Aug. 2, 1934 |